US008803236B1

United States Patent
Lee et al.

(10) Patent No.: US 8,803,236 B1
(45) Date of Patent: Aug. 12, 2014

(54) LATERAL DOUBLE DIFFUSED METAL-OXIDE-SEMICONDUCTOR DEVICE AND METHOD FOR FABRICATING THE SAME

(71) Applicant: Vanguard International Semiconductor Corporation, Hsinchu (TW)

(72) Inventors: Tsung-Hsiung Lee, Taoyuan (TW); Jui-Chun Chang, Hsinchu (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 0 days.

(21) Appl. No.: 13/905,677

(22) Filed: May 30, 2013

(51) Int. Cl.
  H01L 29/772 (2006.01)
  H01L 29/423 (2006.01)
  H01L 21/336 (2006.01)
  H01L 21/365 (2006.01)
  H01L 21/8232 (2006.01)
  H01L 29/66 (2006.01)
  H01L 29/78 (2006.01)

(52) U.S. Cl.
  CPC ...... *H01L 29/7816* (2013.01); *H01L 29/66681* (2013.01)
  USPC .................. 257/340; 257/E29.256; 438/197; 438/533

(58) Field of Classification Search
  None
  See application file for complete search history.

(56) References Cited

U.S. PATENT DOCUMENTS

| | | | | |
|---|---|---|---|---|
| 5,949,104 A | * | 9/1999 | D'Anna et al. | 257/335 |
| 6,048,772 A | * | 4/2000 | D'Anna | 438/301 |
| 6,190,978 B1 | * | 2/2001 | D'Anna | 438/301 |
| 6,545,316 B1 | * | 4/2003 | Baliga | 257/329 |
| 6,600,182 B2 | * | 7/2003 | Rumennik | 257/288 |

(Continued)

OTHER PUBLICATIONS

Cheon-Soo Kim; Joung-Woo Park; Hyun-Kyu Yu, "Trenched sinker LDMOSFET (TS-LDMOS) structure for high power amplifier application above 2 GHz," Electron Devices Meeting, 2001. IEDM '01. Technical Digest. International, vol., no., pp. 40.2.1, 40.2.4, Dec. 2-5, 2001.*

(Continued)

*Primary Examiner* — Thomas L Dickey
*Assistant Examiner* — Joseph Schoenholtz
(74) *Attorney, Agent, or Firm* — Birch, Stewart, Kolasch & Birch, LLP

(57) ABSTRACT

An LDMOS device includes: a semiconductor layer formed over a semiconductor substrate; a gate structure disposed over the semiconductor layer; a first doped region disposed in the semiconductor layer adjacent to a first side of the gate structure; a second doped region disposed in the semiconductor layer adjacent to a second side of the gate structure; a third doped region disposed in the first doped region; a fourth doped region disposed in the second doped region; a trench formed in the third doped region, the first doped region and the semiconductor layer under in the first doped region; an insulating layer covering the third doped region, the gate structure, and the fourth doped region; a conductive layer conformably formed over a bottom surface and sidewalls of the trench; a dielectric layer disposed in the trench; and a diffused region disposed in the semiconductor layer under the trench.

10 Claims, 4 Drawing Sheets

(56) References Cited

U.S. PATENT DOCUMENTS

| | | | |
|---|---|---|---|
| 6,864,533 B2* | 3/2005 | Yasuhara et al. | 257/342 |
| 7,235,845 B2* | 6/2007 | Xu et al. | 257/343 |
| 7,420,247 B2* | 9/2008 | Xu et al. | 257/343 |
| 7,605,040 B2* | 10/2009 | Choi et al. | 438/286 |
| 7,829,947 B2* | 11/2010 | Hebert | 257/343 |
| 8,198,154 B2* | 6/2012 | Hebert | 438/212 |
| 8,604,525 B2* | 12/2013 | Terrill | 257/271 |
| 2005/0082610 A1* | 4/2005 | Shibib et al. | 257/335 |
| 2005/0280085 A1* | 12/2005 | Babcock et al. | 257/341 |
| 2005/0285189 A1* | 12/2005 | Shibib et al. | 257/341 |
| 2007/0013008 A1* | 1/2007 | Xu et al. | 257/384 |
| 2007/0085204 A1* | 4/2007 | Korec et al. | 257/737 |
| 2008/0246086 A1* | 10/2008 | Korec et al. | 257/343 |
| 2010/0163979 A1* | 7/2010 | Hebert | 257/335 |
| 2010/0237416 A1* | 9/2010 | Hebert | 257/343 |
| 2011/0014766 A1* | 1/2011 | Hebert | 438/286 |
| 2011/0073943 A1* | 3/2011 | Hebert | 257/336 |
| 2011/0266620 A1* | 11/2011 | Terrill | 257/343 |
| 2012/0273879 A1* | 11/2012 | Mallikarjunaswamy et al. | 257/335 |
| 2014/0048878 A1* | 2/2014 | Xiao | 257/343 |
| 2014/0057405 A1* | 2/2014 | Zhou et al. | 438/286 |

OTHER PUBLICATIONS

Kashif, Ahsan-Ullah. Optimization of LDMOS Transistor in Power Amplifiers for Communication Systems. Diss. Linköping University, Department of Physics, Chemistry and Biology, Semiconductor Materials, 2010. Linköping: Linköping University Electronic, 2010.*

A. Kashif, T. Johansson, C. Svensson, S. Azam, T. Arnborg, Q. Wahab, Influence of interface state charges on RF performance of LDMOS transistor, Solid-State Electronics, vol. 52, Issue 7, Jul. 2008, pp. 1099-1105.*

* cited by examiner

LATERAL DOUBLE DIFFUSED METAL-OXIDE-SEMICONDUCTOR DEVICE AND METHOD FOR FABRICATING THE SAME

BACKGROUND OF THE INVENTION

1. Field of the Invention

The present invention relates to integrated circuit (IC) devices, and in particular to a lateral double diffused metal-oxide-semiconductor (LDMOS) device and a method for fabricating the same.

2. Description of the Related Art

Recently, due to the rapid development of communication devices such as mobile communication devices and personal communication devices, wireless communication products such as mobile phones and base stations have been greatly developed. In wireless communication products, high-voltage elements of lateral double diffused metal-oxide-semiconductor (LDMOS) devices are often used as radio frequency (900 MHz-2.4 GHz) related elements therein.

LDMOS devices not only have a higher operation frequency, but also are capable of sustaining a higher breakdown voltage, thereby having a high output power so that they can be used as power amplifiers in wireless communication products. In addition, due to the fact that LDMOS devices can be formed by conventional CMOS fabrications, LDMOS devices can be fabricated from a silicon substrate which is relatively cost-effective and employs mature fabrication techniques.

In FIG. 1, a schematic cross section showing a conventional N-type lateral double diffused metal-oxide-semiconductor (LDMOS) device applicable in a radio frequency (RF) circuit element is illustrated. As shown in FIG. 1, the N-type LDMOS device mainly comprises a P+ type semiconductor substrate 100, a P− type epitaxial semiconductor layer 102 formed over the P+type semiconductor substrate 100, and a gate structure G formed over a portion of the P− type epitaxial semiconductor layer 102. A P− type doped region 104 is disposed in the P− type epitaxial semiconductor layer 102 under the gate structure G and a portion of the P− type epitaxial semiconductor layer 102 under the left side of the gate structure G, and a N− type drift region 106 is disposed in a portion of the P− type epitaxial semiconductor layer 102 under the right side of the gate structure G. A P+ type doped region 130 and a N+ type doped region 110 are disposed in a portion of the P type doped region 104, and the P+ doped region 130 partially contacts a portion of the N+ type doped region 110, thereby functioning as a contact region (e.g. P+ type doped region 130) and a source region (e.g. N+ type doped region 110) of the N type LDMOS device, respectively, and another N+ type doped region 108 is disposed in a portion of the P− type epitaxial semiconductor layer 102 at the right side of the N− type drift region 106 to function as a drain region of the N type LDMOS device. In addition, an insulating layer 112 is formed over the gate structure G, covering sidewalls and a top surface of the gate structure G and partially covering the N+ type doped regions 108 and 110 adjacent to the gate structure G. Moreover, the N type LDMOS further comprises a P+ type doped region substantially disposed in a portion of the P− type epitaxial semiconductor layer 102 under the N+ type doped region 110 and the P− type doped region 104 under the N+ type doped region 110. The P+ type doped region 120 physically connects the P− type doped region 104 with the P+ type semiconductor substrate 100.

During operation of the N type LDMOS device shown in FIG. 1, due to the formation of the P+ type doped region 120, currents (not shown) from the drain side (e.g. N+ type doped region 108) laterally flow through a channel (not shown) underlying the gate structure G towards a source side (e.g. N+ type doped region 110), and are then guided by the P− type doped region 104 and the P+ type doped region 120, thereby arriving the P+ type semiconductor substrate 100, such that undesired problems such as inductor coupling and cross-talk between adjacent circuit elements can be avoided. However, formation of the P+ type doped region 120 needs to perform ion implantations of high doping concentrations and high doping energies and thermal diffusion processes with a relative high temperature above of about 900° C., and a predetermined distance D1 is kept between the gate structure G and the N+ type doped region 110 at the left side of the gate structure G to ensure good performance of the N type LDMOS device. Therefore, formation of the P+ type doped region 120 and the predetermined distance D1 kept between the gate structure G and the N+ type doped region 110 relatively increase the on-state resistance (Ron) of the N type LDMOS device and a dimension of the N type LDMOS device, which are unfavorable for further reduction of the fabrication cost and the dimensions of the N type LDMOS device.

BRIEF SUMMARY OF THE INVENTION

Accordingly, an improved lateral double diffused metal oxide semiconductor (LDMOS) device and method for fabricating the same are provided to reduce size and fabrication cost.

An exemplary lateral double diffused metal oxide semiconductor (LDMOS) device comprises: a semiconductor substrate, having a first conductivity type; an epitaxial semiconductor layer formed over the semiconductor substrate, having the first conductivity type; a gate structure disposed over a portion of the epitaxial semiconductor layer; a first doped region disposed in a portion of the epitaxial semiconductor layer adjacent to a first side of the gate structure, having the first conductivity type; a second doped region disposed in a portion of the epitaxial semiconductor layer adjacent to a second side of the gate structure opposite to the first side, having a second conductivity type opposite to the first conductivity type; a third doped region disposed in a portion of the first doped region, having the second conductivity type; a fourth doped region disposed in a portion of the second doped region, having the second conductivity type; a trench formed in a portion of the third doped region, the first doped region and the epitaxial semiconductor layer under in the first doped region; an insulating layer covering the third doped region, the gate structure, and a portion of the fourth doped region; a conductive layer conformably formed over a bottom surface and a plurality of sidewalls of the trench, covering the insulating layer; a dielectric layer disposed in the trench and over the conductive layer; and a diffused region disposed in a portion of the epitaxial semiconductor layer under the first doped region, having the first conductivity type, wherein the diffused region physically contacts the semiconductor substrate and surrounds portions of the sidewalls and the bottom surface of the trench.

An exemplary method for fabricating a lateral double diffused metal oxide semiconductor (LDMOS) device comprises: performing a semiconductor substrate, having a first conductivity type; forming a first doped region in a portion of the semiconductor substrate, having the first conductivity type; forming an epitaxial semiconductor layer over the semiconductor substrate, having the first conductivity type, wherein during formation of the epitaxial semiconductor layer, the first doped region extends upward and a diffused region is formed in a portion of the epitaxial semiconductor layer; forming a gate structure over a portion of the epitaxial semiconductor layer; forming a second doped region in a portion of the epitaxial semiconductor layer adjacent to a first side of the gate structure, having the first conductivity type; forming a third doped region in a portion of the epitaxial semiconductor layer at a second side of the gate structure opposite to the first side, having a second conductivity type opposite to the first conductivity type; forming a fourth doped region in a portion of the second doped region, having the second conductivity type; forming a fifth doped region in a portion of the third doped region, having the second conductivity type; forming an insulating layer over the third doped region, the gate structure, and a portion of the fourth doped region; forming a trench in a portion of epitaxial semiconductor layer underlying the third doped region, the second doped region, and partially exposing the diffused region; performing an ion implant process, implanting dopants of the first conductivity type into the diffused region exposed by the trench; conformably forming a conductive layer in a bottom surface and a plurality of sidewalls of the trench, covering the insulating layer, wherein the conductive layer physically contacts the diffused region; and forming a dielectric layer in the trench and over the conductive layer, wherein the diffused region physically contacts the semiconductor substrate and surrounding portions of the sidewalls and bottom surface of the trench.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

FIGS. 2-7 are schematic cross sections showing a method for fabricating a lateral double diffused metal-oxide-semiconductor (LDMOS) device applicable for a radio frequency (RF) circuit element according to an embodiment of the invention.

Figure 2:
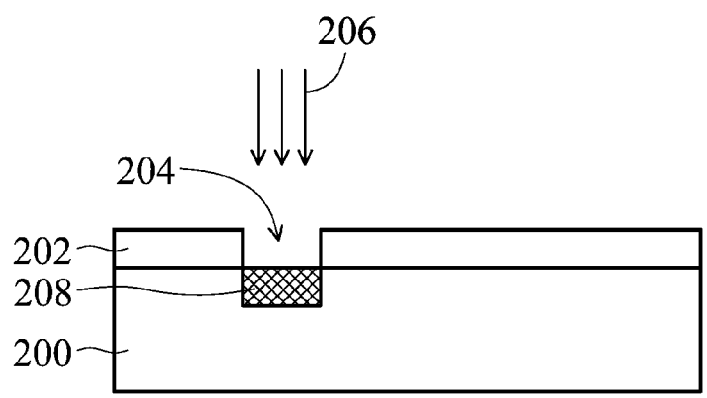
FIGS. 2-7 are schematic cross sections showing a method for fabricating a lateral double diffused metal-oxide-semiconductor (LDMOS) device according to an embodiment of the invention.

Referring to FIG. 2, a semiconductor substrate 200 such as a silicon substrate is first provided. In one embodiment, the semiconductor substrate 200 has a first conductivity type such as a P type, and a dopant concentration of about 0.01-0.03 ohms (Ω). Next, a patterned mask layer 202 is formed over the semiconductor substrate 200, and the patterned mask layer 202 comprises an opening 204 exposing a portion of the semiconductor substrate 200. The patterned mask layer 202 may comprise materials such as photoresists and the opening 204 can thus be formed by conventional photolithography and etching processes.

Next, an ion implant process 206 is performed to implant the portion of the semiconductor substrate 200 exposed by the opening 204 with dopants of the first conductivity type such as the P-type conductivity type, thereby forming a doped region 208 in the semiconductor substrate 200. In one embodiment, the doped region 208 formed by the ion implant process 206 has a dopant concentration greater than that of the semiconductor substrate 200.

Figure 3:
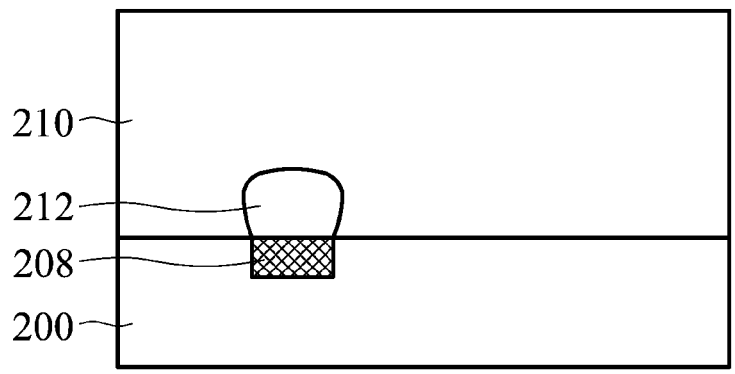

Referring to FIG. 3, after removal of the patterned mask layer 202, an epitaxial semiconductor layer 210 is formed next. The epitaxial semiconductor layer 210 can be doped in-situ with dopants of first conductivity type such as P type during the formation thereof, and the temperature for forming the epitaxial semiconductor layer 210 may be higher than 900° C. Therefore, during the formation of the epitaxial semiconductor layer 210, the P-type dopants in the doped region 208 in the semiconductor substrate 200 may be diffused upward and diffuse into a portion of the epitaxial semiconductor layer 210, thereby forming a diffused region 212 as shown in FIG. 3 after formation of the epitaxial semiconductor layer 210. In one embodiment, a dopant concentration in the epitaxial semiconductor layer 210 is less than that of the semiconductor substrate 200, and a dopant concentration of the doped region 212 formed in a portion of the epitaxial semiconductor layer 210 is greater than that of the epitaxial semiconductor layer 210.

Figure 4:
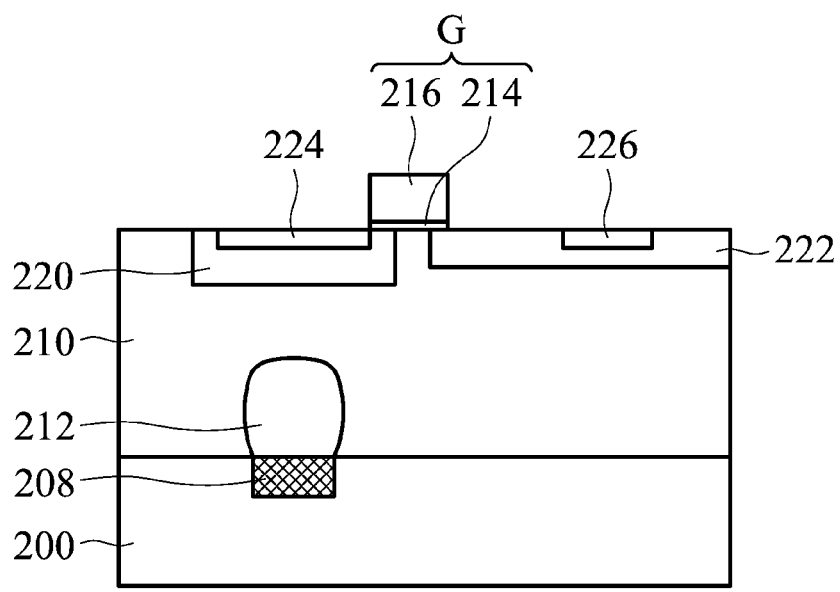

Referring to FIG. 4, a patterned gate structure G is formed over a portion of the epitaxial semiconductor layer 210, and the gate structure G mainly comprises a gate dielectric layer 214 and a gate electrode 216 sequentially formed over a portion of the epitaxial semiconductor layer 210. The gate dielectric layer 214 and the gate electrode 216 of the gate structure G can be formed by conventional gate processes and related gate materials, and are not described here in detail for the purpose of simplicity. Next, a plurality of suitable masks (not shown) and a plurality of ion implant processes (not shown) are then performed to form a doped region 220 in a portion of the epitaxial semiconductor layer 210 at the left side of the gate structure G, and a doped region 222 in a portion of the epitaxial semiconductor layer 210 at the right side of the gate structure G. In one embodiment, the doped region 220 has the first conductivity type such as P type, and the doped region 222 has a second conductivity type such as N type opposite to the P type, and the ion implant processes (not shown) for forming the doped regions 220 and 222 can be ion implant processes with tilted implantation angles. Next, another suitable implant mask (not shown) and an ion implantation process (not shown) are performed to form a doped region 224 and a doped region 226 in a portion of the doped regions 220 and 222 on opposite sides of the gate structure G, respectively, and the configuration shown in FIG. 4 is formed after performing a thermal diffusion process (not shown). In one embodiment, the doped region 224 formed in a portion of the doped region 220 and the doped region 226 formed in a portion of the doped region 222 respectively has the second conductivity type such as N type, and the ion implant process (not shown) for forming the doped regions 224 and 226 can be an ion implantation vertical to a surface of the epitaxial semiconductor layer 210. In addition, the thermal diffusion process used in the processes for forming the doped regions 220, 222, 224 and 226 also cause further diffusion of the diffused region 212 under the epitaxial semiconductor layer 210 and form the configuration as shown in FIG. 4. In one embodiment, the doped region 222 may function as a drift region, and the doped regions 224 and 226 may function as source and drain regions.

Figure 5:
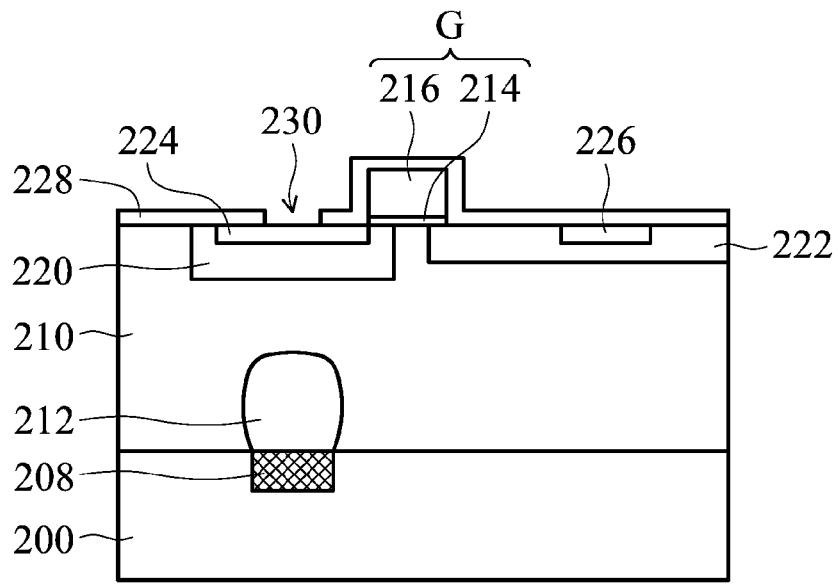

Referring to FIG. 5, an insulating layer 228 is next formed over the epitaxial semiconductor layer 210, and the insulating layer 228 conformably cover a plurality of sidewalls and a top surface of the gate structure G. Next, a patterning process (not shown) is performed to form an opening 230 in a portion of the insulating layer 228. As shown in FIG. 5, the opening 230 exposes a portion of the doped region 224 such that other portions of the epitaxial semiconductor layer 210 and surfaces of the gate structure G are still covered by the insulating layer 228. In one embodiment, the insulating layer 228 may comprise insulating materials such as silicon oxide and silicon nitride, and can be formed by methods such as chemical vapor deposition.

Figure 6:
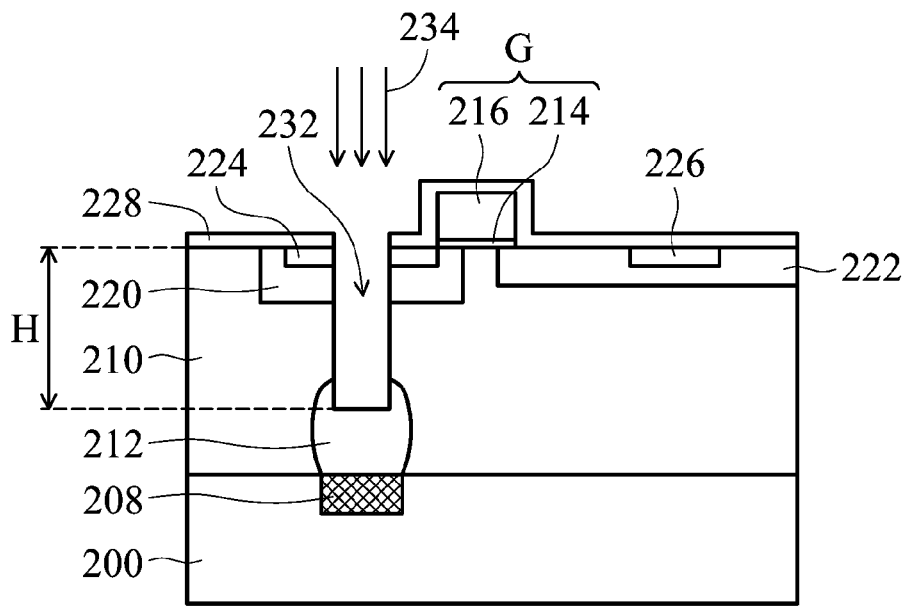

Referring to FIG. 6, an etching process (not shown) is next performed, using the insulating layer 228 as an etching mask, thereby forming a trench 232 in the epitaxial semiconductor layer 210 exposed by the opening 230. As shown in FIG. 6, the trench 232 is formed with a depth H which mainly penetrates the doped region 224, the doped region 220 and the epitaxial semiconductor layer 210, and the trench 232 further extends downwards and penetrates through a portion of the diffused region 212 to expose the diffuse region 212. As shown in FIG. 6, the sidewalls and the bottom surface of the bottom portion of the trench 232 are surrounded by the diffused region 212. Next, an ion implant process 234 is performed, using the insulating layer 228 as an implant mask, to implant dopants with the first conductivity type such as P type into the diffused region 212 exposed by the trench 232, thereby increasing the dopant concentration of the diffused region 212. The diffused region 212 being processed by the ion implant process 234 is then entitled as a diffused region 212' (see FIG. 7).

Figure 7:
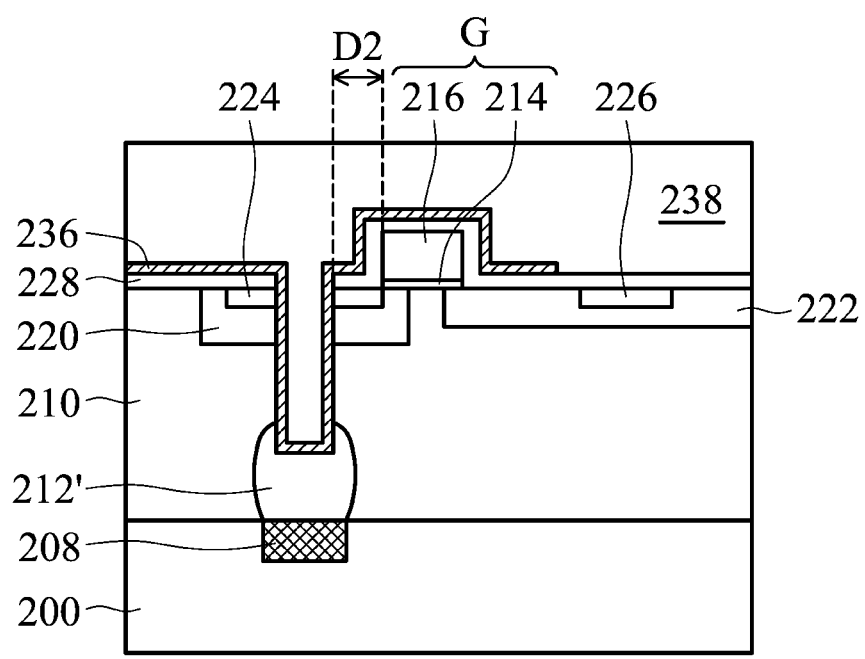

Referring to FIG. 7, a layer of conductive material of, for example, AlCu alloy, AlSiCu alloy, Ti—TiN alloy, W, doped polysilicon, or doped epitaxial semiconductor material is conformably formed over the insulating layer 238 and it further extends over the sidewalls and the bottom surface of the trench 232. At this time, the trench 232 is partially filled with the conductive material but is not entirely filled with the conductive material. Next, the layer of the conductive material is patterned to form a conductive layer 236 by using a suitable patterning mask and a patterning process (both not shown). As shown in FIG. 7, the conductive layer 236 is formed over the insulating layer 228 adjacent to the trench 232 and it extends over the bottom surface and the sidewalls of the trench 232, thereby covering the doped regions 224, 220, the epitaxial semiconductor layer 210, and surfaces of the diffused region 212' exposed by the trench 232, and the conductive layer 236 also covers the gate structure G and a portion of the doped region 222 adjacent to the gate structure G. However, the conductive layer 236 does not cover the doped region 226. Next, a dielectric material such as silicon oxide or spin-on-glass (SOG) is deposited over the conductive layer 236, such that the dielectric material fills the trench 232 and covers the conductive layer 236, the insulating layer 228, and the gate structure G, thereby forming an inter layer dielectric (ILD) layer 238 with a substantially planar top surface. Therefore, an exemplar LDMOS device is substantially fabricated.

Figure 1:
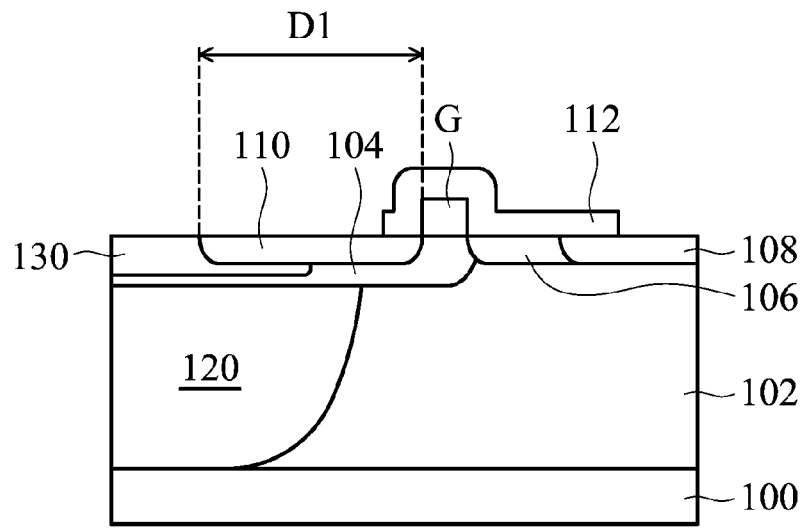
FIG. 1 is schematic cross section of a conventional lateral double diffused metal-oxide-semiconductor (LDMOS) device.

In one embodiment, the gate structure G and the doped regions 224 and 226 of the LDMOS device shown in FIG. 7 can be respectively connected with a sequentially formed conductive element (not shown), and the regions with the first conductivity type can be P type regions, and the regions of the second conductivity type can be N type regions, such that the formed LDMOS device herein is an N type LDMOS device. At this time, the doped region 224 may function as a source region and the doped region 226 may function as a drain region. In this embodiment, during operation of the LDMOS device shown in FIG. 7, currents from the drain side (e.g. the doped region 226) may laterally flow toward the source side (e.g. doped region 224), and then arrive at the semiconductor substrate 200 by the guidance of the doped region 220, the conductive layer 236, and the doped region 212', such that undesired problems such as inductor coupling and cross-talk between adjacent circuit elements can be prevented. In this embodiment, due to the formation of the conductive layer 226 (see FIG. 6) formed in the trench 232 and the diffused region 212' embedded in the epitaxial semiconductor layer 210 contacting the semiconductor substrate 200, such that ion implantation with high dosages and high energies for forming the P+type doped region 120 as shown in FIG. 1 can be avoided, a predetermined distance D2 between the gate structure G and the doped region 234 at the right side of the trench 232 can be less than the predetermined distance D1 as shown in FIG. 1. Therefore, when compared with the N type LDMOS device as shown in FIG. 1, the N type LDMOS device shown in FIG. 7 may have advantages of reducing size and fabrication cost, and formation of the diffused layer 212' also helps to reduce the on-state resistance (Ron) of the N type LDMOS device.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A lateral double diffused metal-oxide-semiconductor (LDMOS) device, comprising:
   a semiconductor substrate, having a first conductivity type;
   an epitaxial semiconductor layer formed over the semiconductor substrate, having the first conductivity type;
   a gate structure disposed over a portion of the epitaxial semiconductor layer;
   a first doped region disposed in a portion of the epitaxial semiconductor layer adjacent to a first side of the gate structure, having the first conductivity type;
   a second doped region disposed in a portion of the epitaxial semiconductor layer adjacent to a second side of the gate structure opposite to the first side, having a second conductivity type opposite to the first conductivity type;
   a third doped region disposed in a portion of the first doped region, having the second conductivity type;
   a fourth doped region disposed in a portion of the second doped region, having the second conductivity type;
   a trench formed in a portion of the third doped region, the first doped region and the epitaxial semiconductor layer under in the first doped region;
   an insulating layer covering the third doped region, the gate structure, and a portion of the fourth doped region;
   a conductive layer conformably formed over a bottom surface and a plurality of sidewalls of the trench, covering the insulating layer;
   a dielectric layer disposed in the trench and over the conductive layer; and
   a diffused region disposed in a portion of the epitaxial semiconductor layer under the first doped region, having the first conductivity type, and the diffused region physically contacts the semiconductor substrate and surrounds portions of the sidewalls and the bottom surface of the trench, and the diffused region does not physically contact the first doped region.

2. The LDMOS device as claimed in claim 1, wherein the first conductivity type is P type and the second conductivity type is N type.

3. The LDMOS device as claimed in claim 1, wherein the third doped region is a source region and the fourth doped region is a drain region.

4. The LDMOS device as claimed in claim 1, wherein the diffused region has a dopant concentration greater than that of the epitaxial semiconductor layer.

5. The LDMOS device as claimed in claim 1, wherein the conductive layer comprises AlCu alloy, AlSiCu alloy, Ti—TiN alloy, W, doped polysilicon or doped epitaxial semiconductor materials.

6. A method for fabricating a lateral double diffused metal oxide semiconductor (LDMOS) device, comprising:
   performing a semiconductor substrate, having a first conductivity type;
   forming a first doped region in a portion of the semiconductor substrate, having the first conductivity type;
   forming an epitaxial semiconductor layer over the semiconductor substrate, having the first conductivity type, wherein during formation of the epitaxial semiconductor layer, the first doped region extends upward and a diffused region is formed in a portion of the epitaxial semiconductor layer;
   forming a gate structure over a portion of the epitaxial semiconductor layer;
   forming a second doped region in a portion of the epitaxial semiconductor layer adjacent to a first side of the gate structure, having the first conductivity type;
   forming a third doped region in a portion of the epitaxial semiconductor layer at a second side of the gate structure opposite to the first side, having a second conductivity type opposite to the first conductivity type;
   forming a fourth doped region in a portion of the second doped region, having the second conductivity type;
   forming a fifth doped region in a portion of the third doped region, having the second conductivity type;
   forming an insulating layer over the third doped region, the gate structure, and a portion of the fourth doped region;
   forming a trench in a portion of epitaxial semiconductor layer underlying the third doped region, the second doped region, and partially exposing the diffused region;
   performing an ion implant process, implanting dopants of the first conductivity type into the diffused region exposed by the trench;
   conformably forming a conductive layer in a bottom surface and a plurality of sidewalls of the trench, covering the insulating layer, wherein the conductive layer physically contacts the diffused region; and
   forming a dielectric layer in the trench and over the conductive layer, wherein the diffused region physically contacts the semiconductor substrate and surrounding portions of the sidewalls and bottom surface of the trench.

7. The method as claimed in claim 6, wherein the first conductivity type is P type and the second conductivity type is N type.

8. The method as claimed in claim 6, wherein the fourth doped region is a source region and the fifth doped region is a drain region.

9. The method as claimed in claim 6, wherein after the ion implant process, the diffused region exposed by the trench has a dopant concentration greater than that of the epitaxial semiconductor layer.

10. The method as claimed in claim 6, wherein the conductive layer comprises AlCu alloy, AlSiCu alloy, Ti—TiN alloy, W, doped polysilicon or doped epitaxial semiconductor materials.

\* \* \* \* \*